(12) United States Patent
Dai et al.

(10) Patent No.: US 7,952,368 B1
(45) Date of Patent: May 31, 2011

(54) APPARATUS AND METHOD FOR MEASURING DIODE CHIP

(75) Inventors: Ming-Ji Dai, Hsinchu (TW);
Sheng-Liang Li, Taipei (TW); Ra-Min Tain, Taipei County (TW); Chun-Kai Liu, Taipei (TW); Chung-Yen Hsu, Taoyuan County (TW); Ming-Te Lin, Taipei County (TW); Kuang-Yu Tai, Hsinchu (TW)

(73) Assignee: Industrial Technology Research Institure, Hsinchu (TW)

( * ) Notice: Subject to any disclaimer, the term of this patent is extended or adjusted under 35 U.S.C. 154(b) by 0 days.

(21) Appl. No.: 12/876,218

(22) Filed: Sep. 6, 2010

(30) Foreign Application Priority Data

Feb. 4, 2010 (TW) ................................ 99103362 A

(51) Int. Cl.
*G01R 31/00* (2006.01)
(52) U.S. Cl. ............... 324/750.03; 324/762.07; 374/178
(58) Field of Classification Search .................. None
See application file for complete search history.

(56) References Cited

U.S. PATENT DOCUMENTS

| 5,639,163 | A * | 6/1997 | Davidson et al. | 374/178 |
|---|---|---|---|---|
| 6,612,738 | B2 * | 9/2003 | Beer et al. | 374/183 |
| 7,052,180 | B2 * | 5/2006 | Shih | 374/178 |
| 2010/0004892 | A1 | 1/2010 | Lin et al. | |

FOREIGN PATENT DOCUMENTS

TW 200925571 6/2009

* cited by examiner

*Primary Examiner* — Ha Tran T Nguyen
*Assistant Examiner* — Arleen M Vazquez
(74) *Attorney, Agent, or Firm* — Jianq Chyun IP Office

(57) ABSTRACT

An apparatus and a method for measuring a diode chip are provided. The diode chip is placed on a thermal conductive element. The apparatus measures an instant starting current and a first temperature, which is associated with the instant starting current, of the thermal conductive element. After the diode chip operates, the apparatus adjusts the temperature of the thermal conductive element to a second temperature, such that the current of the diode chip is adjusted to be equal to the instant starting current. The apparatus calculates a property of the diode chip according to a real power of the diode chip and a difference between the first temperature and the second temperature.

10 Claims, 4 Drawing Sheets

APPARATUS AND METHOD FOR MEASURING DIODE CHIP

CROSS-REFERENCE TO RELATED APPLICATION

This application claims the priority benefit of Taiwan application serial no. 99103362, filed on Feb. 4, 2010. The entirety of the above-mentioned patent application is hereby incorporated by reference herein and made a part of this specification.

TECHNICAL FIELD

The disclosure relates to an apparatus and a method for measuring a diode chip, and more specifically, to an apparatus and a method for measuring a diode chip which is driven by an alternating-current (AC) voltage.

BACKGROUND

Recently, benefited from the drastic development of the epitaxy technology, LED semiconductor technology has successfully improved the light emitting efficiency of LED chips. As such, LEDs are more widely used, for example in projection pens, and illuminations. LEDs are known as having advantages of small sizes, longer lifetime, low contamination, and low cost. In addition, LEDs have better optical characteristics such as good color saturation, and ideal dynamic color control. In these manners, LED and related technologies are specifically concerned for further development.

Generally, LEDs have less power consumption, less pollution, and smaller sizes than conventional lamps (e.g. light bulbs). Besides, the appearance of alternating-current-driven (AC-driven) LED makes the LED illumination system has an advantageous position in the market. However, alike the direct-current-driven (DC-driven) LED chip, the AC-driven LED chip has the same problem of having a low light emitting efficiency. The current LED chips convert most of the inputted power into heat while few of the inputted power is converted into light. Therefore, how to avoid overheating is a major issue in the field of LED. Unfortunately, under the situation that the light emitting efficiencies of the current LED chips is limited, most of the inputted power is converted into heat causing a drastic increase on heating generating density. In such a way, the overheat problem is a bottleneck in technology development. Thermal resistance, is defined as a quantity of a junction temperature of an LED being subtracted the ambient temperature and further divided by a corresponding input power. The thermal resistance is a criterion for evaluating a capability of heat dissipation of an LED package. A larger thermal resistance indicates a worse capability of heat dissipation, while a smaller thermal resistance indicates a better capability of heat dissipation.

When packaging an LED, an upper limit of the thermal resistance should be restricted. As such, the measurement of thermal resistances of components is important and representative. As to the parameters for calculating the thermal resistance, the ambient temperature can be conveniently obtained by measuring with a thermal couple. As to the thermal-generating component, the inputted power is also known and easy to obtain. However, a junction of a packaged LED is encapsulated inside, and therefore the junction temperature of LED chip is difficult to measure with a direct measurement. As such, the junction temperature is usually measured with an indirect electrical measurement. If the method can fast and accurate measuring the thermal conductivity and the effect on optical characteristics due to heat of the component to be tested, it would be helpful in facilitating to the design and testing of the thermal conductivity of LED chips.

As same as the DC-driven LED chip, the junction temperature of the AC-driven LED chip could not be measured directly, such that the junction temperature of the AC-driven LED chip is also measured with an indirect electrical measurement. However, since the AC-driven LED chip is driven by an AC voltage rather than a DC voltage, the indirect electrical measurement for the thermal resistance of the AC-driven LED chip is different from that for the DC-driven LED chip. The AC voltage is a sine periodic wave, such that the voltage value thereof is not constant as the DC voltage. Establishment of the indirect electrical measurement for the thermal resistance of the AC-driven LED chip is helpful to improve the design of the packaged AC-driven LED chip.

Taiwan patent publication No. 200925571 disclosed an apparatus for measuring LED characteristic and chip temperature. The process of the measurement has two major steps. One step is to measure a bias voltage and a temperature sensitive parameter (TSP) by a thermal conductive type approach and an inputting-pulse type approach. Another step is to measure the voltage value of the LED chip under the real operation, then to calculate the temperature and the thermal resistance of the packaged LED chip according to the TSP correlation curve. However, the apparatus and method are only capable of measuring the DC-driven LED chip rather than the AC-driven LED chip. Moreover, the apparatus and method are limited to measure the thermal characteristic of the DC-driven LED chip, but the apparatus and method fails to integrate the methods for measuring the illumination characteristic, the thermal characteristic, and the electric characteristic of the DC-driven LED chip.

U.S. patent application Ser. No. 12/353,294 discloses a method for measuring the junction temperature of an AC-driven LED chip. The method for measuring the AC-driven chip is similar to the method for measuring the DC-driven chip. The AC-driven LED chip is measured by the way of inputting an AC voltage. The method of AC-driven measurement has two major steps. In the first step, an initial voltage is applied to the LED chip, the temperature of a substrate of the LED chip is controlled, and the current of the LED chip and the temperature of the substrate are measured, such that a characteristic curve of the LED chip could be obtained. In the second step, a resistor having a slight resistance is connected to the LED chip in series so as to really handle the input of the rated AD current, and a dual-channel data acquisition (DAQ) card is used to simultaneously extract the resistance value of the resistor and the voltage value of the AC-voltage. Then, according to the waveform of the applied AC voltage, the initial voltage of the LED chip and the corresponding voltage value of the resistor are found, so as to calculate the current value. Moreover, a current difference between the initial current and the heat-balanced current, so as to obtain the temperature difference of the LED chip according to the characteristic curve of the LED chip. Then, the junction temperature of the LED chip could be obtained by summing up the temperature difference and the initial temperature.

Although the method disclosed by Taiwan patent publication No. 200925571 could be used to speedily measure the thermal resistance of the LED chip, but the method is limited to measure the thermal characteristic of the DC-driven LED chip and fails to integrate the methods for measuring the illumination, thermal and the electric characteristics of the DC-driven LED chip. The method disclosed by patent application Ser. No. 12/353,294 could be used to measure the AC-driven LED chip, but it is too complicated and needs two steps while an extra resistor should be series-connected to the LED chip when the second step is performed. Since the result of the measurement is influenced by the resistance of the resistor, and it is hard to determine which resistor should be selected, the method is inconvenient and hard to control.

SUMMARY

A method for measuring a diode chip is introduced herein. The method comprises disposing the diode chip on a thermal conductive component; applying a voltage to the diode chip, measuring an instant starting current of the diode chip by using a current measurement unit, and measuring a temperature of the thermal conductive component as a first temperature by using a temperature measurement unit; controlling the temperature of the thermal conductive component by using a temperature control module until the diode chip's current measured by the current measurement unit is equal to the instant starting current; and measuring the temperature of the thermal conductive component as a second temperature by using the temperature measurement unit when the diode chip's current measured by the current measurement unit is equal to the instant starting current.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

The disclosed embodiments are adapted for obtaining a better result in complete, fast and accurate measurement of optical and thermal characteristics of an LED. The methods of the disclosed embodiments not only could be adapted to measure the electric characteristic of the DC-driven diode chip, but also that of the AC-driven diode chip. Several exemplary embodiments are given below for illustration purpose without restriction of the scope of the present disclosure. The exemplary embodiments may be varied or modified according to the spirit of the present disclosure by adaptively combine one with the others without limit to a single embodiment.

Figure 1:
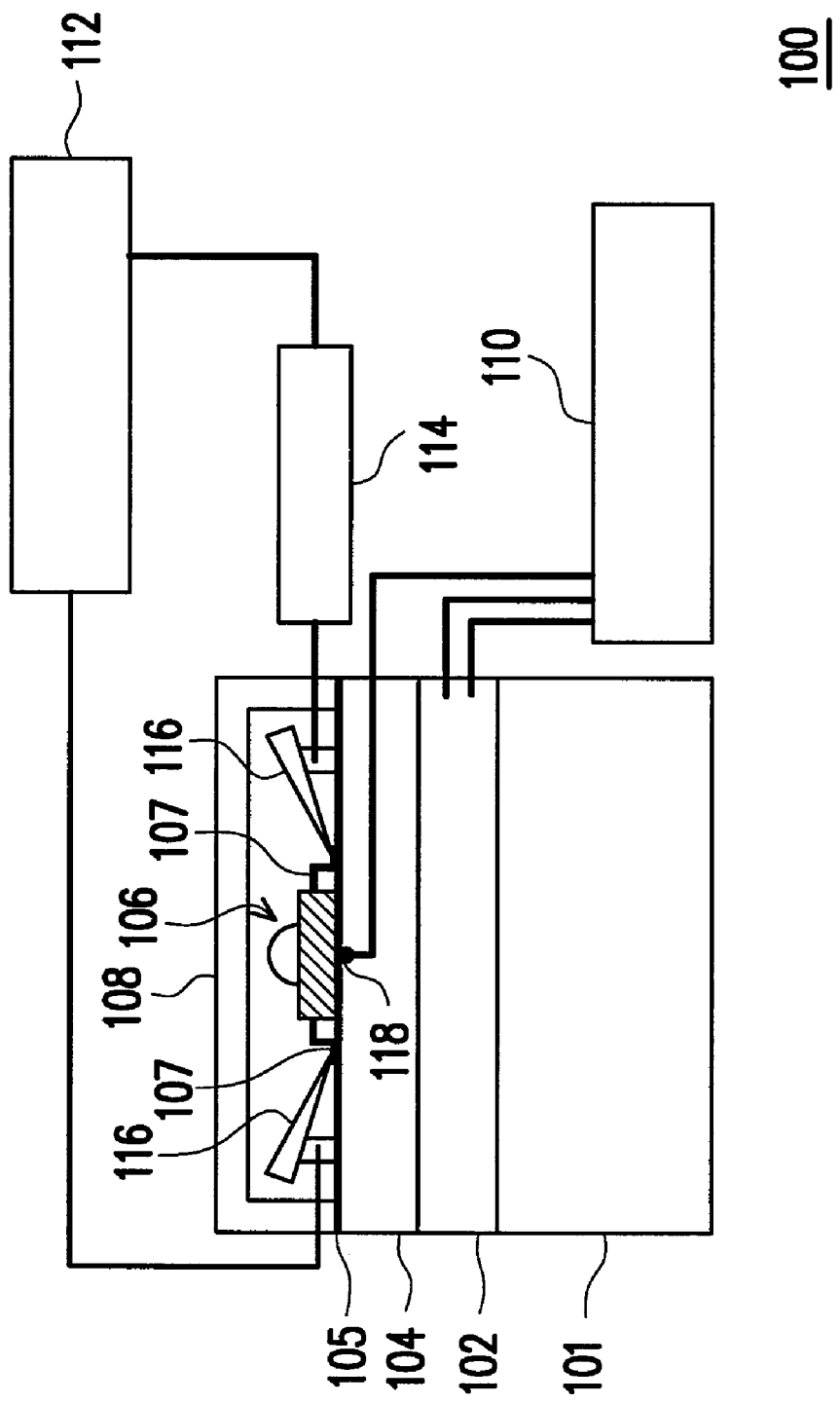
FIG. 1 is a schematic diagram illustrating an apparatus for measuring a characteristic of a diode chip, according to an exemplary embodiment.

FIG. 1 is a schematic diagram illustrating an apparatus 100 for measuring a characteristic of a diode chip 106, according to an exemplary embodiment of the present disclosure. Referring to FIG. 1, a temperature control module is used for providing a temperature control. As shown in FIG. 1, the temperature control module can include a temperature control component 102, such as a heater, a thermo-electric cooler, or the like. The thermo-electric cooler can cool down the temperature to be lower than a room temperature, such that the apparatus 100 could be used in measuring a temperature lower than the room temperature. A thermal module 101 is employed for providing stable heat dissipation for a heat source introduced by the temperature control component 102. Especially, the thermal module 101 could be used to dissipate the heat generated by the thermo-electric cooler. Further, if a heater is used to increase the temperature, it does not require the thermal module 101. The temperature control module may further include a certain control circuit, for example a temperature controller 110, for achieving a temperature control. The temperature controller 110 could be a proportional-integral-derivative (PID) controller, a shutdown reactor cooling (SRC) controller and so on.

An exemplary embodiment of the present disclosure further proposes to heat or cool the diode chip 106 by a thermal conductive type approach, to achieve the desired temperature. According to an aspect of the exemplary embodiment, a thermal conductive component 104 is coupled to the temperature control component 102. Therefore, the thermal conductive component 104 is adapted to achieve a balance of temperature with the temperature control component 102 and obtain the desired temperature in a short time. The thermal conductive component 104 for example can include a structural layer of a metal having a high thermal conductivity, e.g., copper, bronze, aluminum and so on. In an exemplary embodiment of the present disclosure, the surface of the thermal conductive component 104 is coated with an insulation film 105 having a high thermal conductivity. The insulation film 105 is made of, for example, a material selected from a group consisting of aluminum oxide, diamond-like carbon (DLC) and so on. The electric insulation characteristic of the insulation film 105 prevents the diode chip 106 from leakage current leaked through the thermal conductive component 104, such that the accuracy of the measurement would not be influenced accordingly. Moreover, the apparatus 100 may further include a heat insulation cover 108 overlaying the thermal conductive component 104, to form a heat insulating space. The heat insulation cover 108 can be, for example, composed of a combination of heat insulating materials such as adiabatic asbestos and bakelite.

In the exemplary embodiment, the diode chip 106 has at least a light emitting diode (LED), and the diode chip 106 is driven by an AC voltage. However, the present disclosure is not limited thereto. For example, in an exemplary embodiment of the present disclosure, the diode chip 106 to be measured has at least a normal diode rather than a light emitting diode. Furthermore, in an exemplary embodiment of the present disclosure, the diode chip 106 is driven by a DC voltage rather than an AC voltage. The diode chip 106 to be measured, according to an aspect of the exemplary embodiment, is for example adhered on the thermal conductive component 104 by thermal conductive paste. The diode chip 106 is preferably received within the heat insulating space configured by the heat insulation cover 108 to obtain a relative stable temperature. However, it should be noted that the heat insulation cover 108 is preferred but not an absolutely necessary component for the apparatus according to the present disclosure. Additionally, in an exemplary embodiment of the present disclosure, the apparatus 100 has two fixtures 116 respectively contact with the two pins 107 of the diode chip 106 to fasten the diode chip 106 on the thermal conductive component 104, such that a person measuring the diode chip 106 can replace the diode chip 106 in a short time. Moreover, in order to avoid the result of thermal measurement of the diode chip 106 being influenced by the light absorbance of the fixtures 116, the fixtures 116 may be made of a white material or coated with barium sulphate ($BaSO_4$) in some exemplary embodiments of the present disclosure. Because the fixtures 116 could be used to delivery power to drive the diode chip 106, no extra solder wire is needed to connect the voltage source 112 with the two pins 107 of the diode chip 106.

The temperature control module further has a temperature measurement unit 118, which is located below the diode chip 106 and positioned at the join part of the substrate of the diode chip 106 and the thermal conductive component 104, to measure the temperature of the thermal conductive component 104. Basically, because the thermal conductive component 104 and the insulation film 105 have high thermal conductivities, the temperature measured by the temperature measurement unit 118 is not only equal to the temperature of the thermal conductive component 104, but also to the temperature of the substrate of the diode chip 106. The temperature measurement unit 118 could be, for example, a thermocouple, a thermistor, or a resistance temperature detector (RTD).

The apparatus 100 further has a voltage source 112 for applying a voltage to the diode chip 106. In an exemplary embodiment, the voltage source 112 is a source meter which can provide a current to the diode chip 106, and simultaneously measure the output voltage thereof. In an exemplary embodiment, the current measurement component of the source meter 112 could be independent from the source meter 112 to obtain a more accurate current value. The independent current measurement component could be a data acquisition (DAQ) card electrically connected to the voltage source 112 and the diode chip 106. In an exemplary embodiment, the current resolution of the DAQ card is less than 0.1 mini ampere (mA). Therefore, the current value measured by the DAQ card has a high accuracy.

During the process of measuring the diode chip 106, the temperature control module is used to control the temperatures of the thermal conductive component 104 and the substrate of the diode chip 106 to be a constant temperature, e.g. 25° C. Before the voltage source 112 applies the voltage to the diode chip 106, due to the thermal balance, the junction temperature of the diode chip 106 is the same as the temperature of the thermal conductive component 104. Then, after the voltage source 112 applies the voltage to the diode chip 106, the diode chip 106 is driven. In the beginning of applying the voltage to the diode chip 106, a current measurement unit 114 measures an instant starting current of the diode chip 106, and the temperature measurement unit 118 measures the temperature of the thermal conductive component 104 as a first temperature. In an exemplary embodiment, the diode chip 106 is driven by an AC voltage, and instant starting current of the diode chip 106 measured by the current measurement unit 114 is equal to a root-mean-square (RMS) value of the current flowing through the diode chip 106 within a first half period of the AC voltage. In other words, the measured instant starting current is an RMS current. Because the diode chip 106 is not influenced by the thermal effect in the beginning of applying the voltage to the diode chip 106, the measured instant starting current is equal to the current value corresponding to the junction temperature (i.e. the first temperature) of the diode chip 106.

Figure 2:
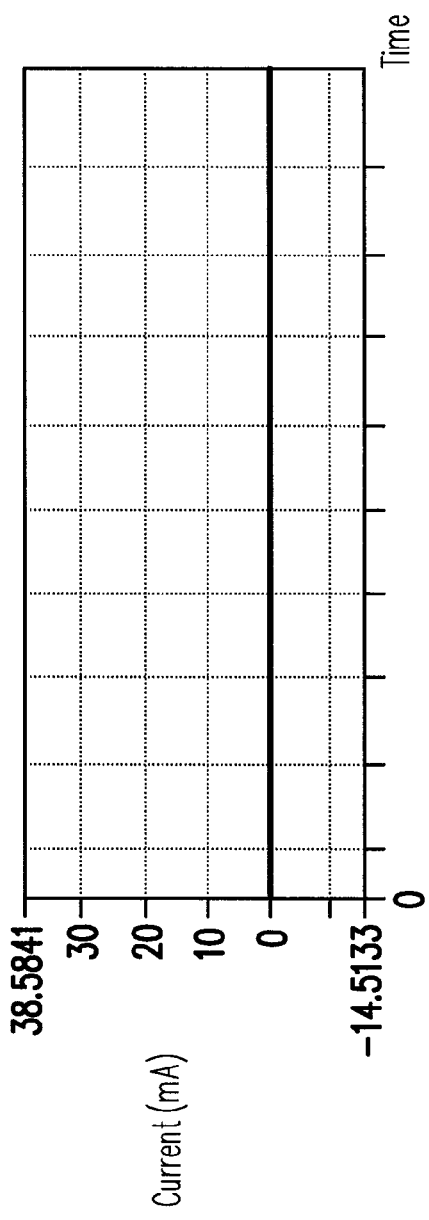
FIG. 2 is a diagram illustrating the relationship between the time and the current of the diode chip before the voltage source applies the voltage to the diode chip.
Figure 3:
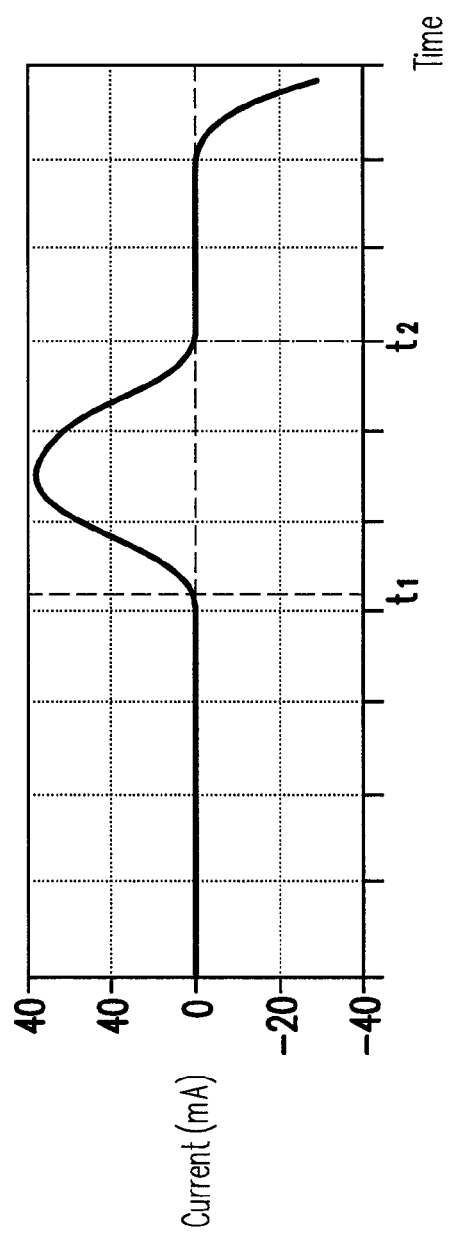
FIG. 3 is a diagram illustrating the relationship between the time and the current of the diode chip 106 when the voltage source begins to apply the voltage to the diode chip.

Please refer FIGS. 2 and 3. FIG. 2 is a diagram illustrating the relationship between the time and the current of the diode chip 106 before the voltage source 112 applies the voltage to the diode chip 106. FIG. 3 is a diagram illustrating the relationship between the time and the current of the diode chip 106 when the voltage source 112 begins to apply the voltage to the diode chip 106. As shown in FIG. 2, before the voltage source 112 applies the voltage to the diode chip 106, the corresponding current value is zero. As shown in FIG. 3, in the beginning of applying the voltage to the diode chip 106, the current measurement unit 114 calculates the RMS current of the diode chip 106 according to the measured current values measured within the interval between $t_1$ and $t_2$. The calculated RM current of the diode chip 106 is the instant starting current. Moreover, in an exemplary embodiment, if the diode chip 106 is driven by a DC voltage, the waveform of the current measured by the current measurement unit 114 would be different from that shown in FIG. 3. In such case, the instant starting current could be calculated according to the measured current values of the diode chip 106 within a time interval after the voltage source 112 begins to apply the voltage to the diode chip 106. The time interval could be, for example, less than one millisecond.

After the voltage is applied to the diode chip 106, the temperature of the diode chip 106 is raised gradually due to the power consumption. Since the temperature of the diode chip 106 is raised, the current of the diode chip 106 is increased accordingly. In order to measure the characteristic of the diode chip 106, when the voltage is applied to the diode chip 106, the temperature control module begins to control the temperature of the thermal conductive component 104 until the diode chip's current measured by the current measurement 114 unit is equal to the instant starting current. Additionally, when the temperature of the thermal conductive component 104 is controlled, the temperature measurement unit 118 measures the temperature of the thermal conductive component 104 as a second temperature when the diode chip's current measured by the current measurement unit 114 is equal to the instant starting current. If the diode chip 106 is driven by an AC voltage, the diode chip's current measured by the current measurement unit 114 is the RMS current of the diode chip 106.

Figure 4:
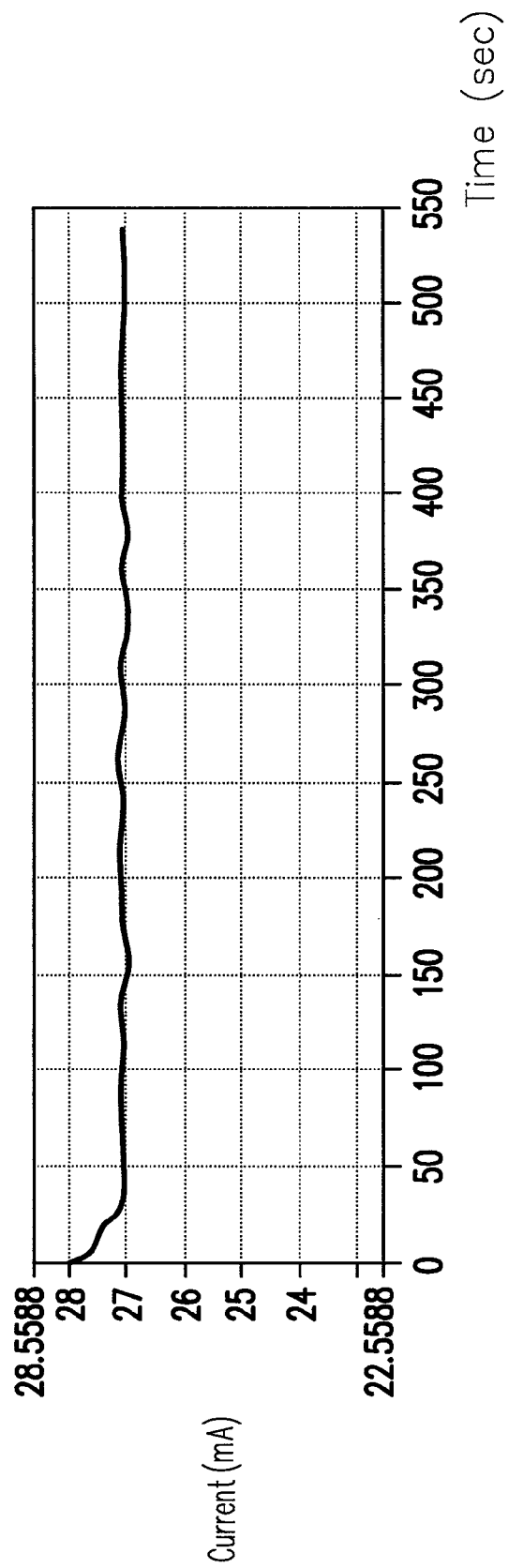
FIG. 4 illustrates the relationship between the time and the current of the diode chip when the temperature of the thermal conductive component is controlled by the temperature control module.

Please refer to FIG. 4, which illustrating the relationship between the time and the current of the diode chip 106 when the temperature of the thermal conductive component 104 is controlled by the temperature control module. In the exemplary embodiment, the instant starting current of the diode chip 106 measured by the current measurement unit 114 is equal to 27.05732 mA. Due to the thermal effect, the current of the diode chip 106 is raised up to be 28 mA. Then, the temperature control module begins to decrease the temperature of the thermal conductive component 104. When the temperature of the thermal conductive component 104 is decreased, the junction temperature of the diode chip 106 is decreased accordingly, such that the current of the diode chip 106 is decreased. When the temperature of the thermal conductive component 104 is decreased, if the diode chip's current measured by the current measurement unit 114 is equal to the instant starting current, the temperature of the thermal conductive component 104 measure by the temperature measurement unit 118 is equal to the second temperature. For example, as shown in FIG. 4, after the $500^{th}$ second when the temperature control module begins to decrease the temperature of the thermal conductive component 104, the current of the diode chip 106 is equal to the instant starting current, the temperature measured by the temperature measurement unit 118 at that time is equal to the second temperature.

In an exemplary embodiment, the current measurement unit 114 calculates a real power of the diode chip 106 when the voltage is applied. If the real power of the diode chip 106 is $P_{real}$, the real power $P_{real}$ is represented as follows:

$$P_{real} = \int_0^T \frac{V(t) \times I(t)}{T} dt = P_{apparent} \times PF \quad (1)$$

$$P_{apparent} = V_{rms} \times I_{rms} \quad (2)$$

where,

V(t) is the voltage value of the voltage applied to the diode chip 106 at the time t;

I(t) is the current value of the diode chip 106 at the time t;

T is a period for sampling the voltage and the current. In an exemplary embodiment, if the diode chip 106 is driven by an AC voltage, T could be the period of the AC voltage;

$P_{apparent}$ is the apparent current of the diode chip 106;

$V_{rms}$ is the RMS voltage of the diode chip 106;

$I_{rms}$ is the RMS current of the diode chip 106;

PF is the power factor of the diode chip 106.

The current measurement 114 or a calculation circuit (not shown) of the apparatus 100 substrates the second temperature from the first temperature to obtain a different between the first temperature and the second temperature. For example, if the first temperature is $T_J$, the second temperature is $T_C$, and the difference is $\Delta T$, the difference $\Delta T$ is represented as follows:

$$\Delta T = T_J - T_C \quad (3)$$

The current measurement 114 or the calculation circuit obtains the thermal resistance of the diode chip 106 by dividing the difference $\Delta T$ by the real power real power $P_{real}$. If the thermal resistance of the diode chip 106 is $R_{JC}$, the thermal resistance $R_{JC}$ could be represented as follows:

$$R_{JC} = \frac{\Delta T}{P_{real}} = \frac{T_J - T_C}{P_{real}} \quad (4)$$

Figure 5:
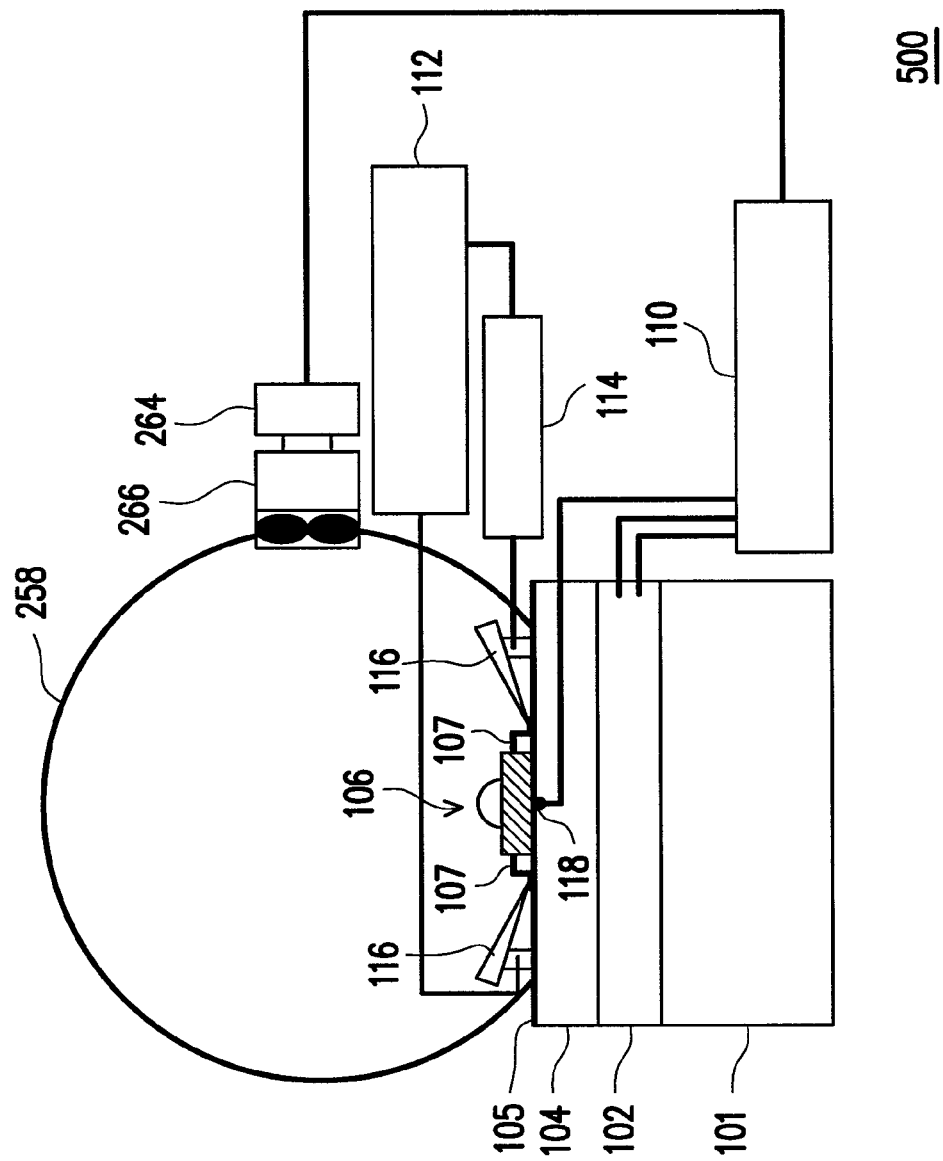
FIG. 5 is a schematic diagram illustrating an apparatus for measuring a characteristic of the diode chip, according to an exemplary embodiment.

FIG. 5 is a schematic diagram illustrating an apparatus 500 for measuring a characteristic of the diode chip 106, according to an exemplary embodiment of the present disclosure. Referring to FIG. 5, there is shown a structure substantially similar to that shown in FIG. 1, except that the heat insulation cover 108 is replaced by an integrating sphere 258 assembled to the thermal conductive component 104. A chip fixing structure is configured to fix the diode chip 106, and to prevent a light leakage from the integrating sphere 258. The apparatus 500 further includes a temperature control unit disposed under the thermal conductive component 104. The temperature control unit for example includes the temperature control component 102 and the thermal module 101. The thermal conductive unit 104 is adapted to achieve a same temperature of the temperature control component 102 in a short time. Associating with the temperature control component 102, the thermal module 101 is adapted to control the temperature variation. Further, a source meter 112 provides a current to the diode chip 106, and reads a voltage value of the diode at the same time. According to an aspect of the embodiment, the apparatus may further include a DAQ card 114 for more accurately read the voltage value. According to a further aspect of the embodiment, besides controlling the temperature of the temperature control component 102, the temperature control module 110 may also control the temperature of another thermal control component 266 to control the temperature of the integrating sphere 258. The temperature control component 266 is cooperatively operated the thermal module 264.

According to an embodiment of the present disclosure, the diode chip can be fast installed and provided with power supply. According to the embodiment, the integrating sphere is designed to be a sphere which can be heated. In such a way, a substrate operation temperature and an ambient temperature can be controlled, so as to obtain a correlation between the optical characteristics and the ambient temperature (or the substrate operation temperature).

The integrating sphere, for example scatters the light emitted from the LED chip, and then integrates the scattered light in sum to obtain an optical characteristic of the LED chip. In such a way, the present disclosure is capable of simultaneously measuring the optical characteristics of the LED chip and the thermal characteristics. For example, when a real current is inputted, the optical characteristics are measured, and when a small current is inputted, the chip temperature and the thermal resistance of the LED are measured. According to a further aspect of the embodiment, the integrating sphere is a constant temperature device, so that the integrating sphere can be further used for controlling an ambient temperature variation, so as to observe a variation of the optical characteristics corresponding to a change of the ambient temperature.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for measuring a diode chip, the method comprising:
    disposing the diode chip on a thermal conductive component;
    applying a voltage to the diode chip, measuring an instant starting current of the diode chip by using a current measurement unit, and measuring a temperature of the thermal conductive component as a first temperature by using a temperature measurement unit;
    controlling the temperature of the thermal conductive component by using a temperature control module until the diode chip's current measured by the current measurement unit is equal to the instant starting current; and
    measuring the temperature of the thermal conductive component as a second temperature by using the temperature measurement unit when the diode chip's current measured by the current measurement unit is equal to the instant starting current.

2. The method as claimed in claim 1 further comprising:
    calculating a real power of the diode chip when the voltage is applied;
    subtracting the second temperature from the first temperature to obtain a difference between the first temperature and the second temperature; and
    dividing the difference by the real power to obtain a thermal resistance of the diode chip.

3. The method as claimed in claim 1, wherein the voltage is an alternating-current (AC) voltage, and the measured current and the instant current of the diode chip are root-mean-square (RMS) currents.

4. The method as claimed in claim 1, wherein the voltage is a direct-current (DC) voltage.

5. The method as claimed in claim 1, wherein the diode chip has at least a light emitting diode (LED).

6. An apparatus adapted to measure a diode chip, the apparatus comprising:
- a thermal conductive component, adapted to dispose the diode chip;
- a voltage source, adapted to apply a voltage to the diode chip;
- a current measurement unit, adapted to measure a current of the diode chip when the voltage is applied to the diode chip;
- a temperature measurement unit, adapted to measure a temperature of the thermal conductive component; and
- a temperature control module, adapted to control the temperature of the thermal conductive component;

wherein when the voltage source begins to apply the voltage to the diode chip, the current measurement unit measures an instant starting current of the diode chip, and the temperature measurement unit measures a temperature of the thermal conductive component as a first temperature;

wherein after the voltage is applied to the diode chip, the temperature control module controls the temperature of the thermal conductive component to be a second temperature, such that the diode chip's current measured by the current measurement unit is equal to the instant starting current, where the second temperature is different from the first temperature.

7. The current measurement unit as claimed in claim 6, wherein the apparatus calculates a real power of the diode chip when the voltage is applied, subtracts the second temperature from the first temperature to obtain a difference between the first temperature and the second temperature, and divides the difference by the real power to obtain a thermal resistance of the diode chip.

8. The apparatus as claimed in claim 6, wherein the voltage is an alternating-current (AC) voltage, and the measured current and the instant current of the diode chip are root-mean-square (RMS) currents.

9. The apparatus as claimed in claim 6, wherein the voltage is a direct-current (DC) voltage.

10. The apparatus as claimed in claim 6, wherein the diode chip has at least a light emitting diode (LED).

* * * * *